United States Patent [19]

Buks

[11] Patent Number: 5,280,237

[45] Date of Patent: Jan. 18, 1994

[54] METHOD FOR TESTING SEMICONDUCTOR INTEGRATED CIRCUITS SOLDERED TO BOARDS AND USE OF A TRANSISTOR TESTER FOR THIS METHOD

[75] Inventor: Manfred Buks, Henstedt-Ulzburg, Fed. Rep. of Germany

[73] Assignee: ITA Ingenieurbüro für Testaufgaben GmbH, Hamburg, Fed. Rep. of Germany

[21] Appl. No.: 855,666

[22] Filed: Mar. 23, 1992

[30] Foreign Application Priority Data

Mar. 30, 1991 [DE] Fed. Rep. of Germany ....... 4110551

[51] Int. Cl.⁵ .................................................. G01R 31/00
[52] U.S. Cl. ............................... 324/158 R; 324/73.1; 324/158 T; 371/15.1
[58] Field of Search ...................... 324/158 R, 73.1, 158 T; 371/22.6, 22.1, 371/15.1, 24; 357/41; 437/8; 257/48, 40

[56] References Cited

U.S. PATENT DOCUMENTS

| 4,035,826 | 7/1977 | Morton et al. ......................... 357/42 |
| 4,779,041 | 10/1988 | Williamson, Jr. ................ 324/158 R |
| 4,779,043 | 10/1988 | Williamson, Jr. ................ 324/158 R |
| 4,817,012 | 3/1989 | Cali' ................................. 324/158 T |
| 4,853,628 | 8/1989 | Gouldsberry et al. ......... 324/158 R |
| 4,963,824 | 10/1990 | Hsieh et al. ..................... 324/158 R |
| 4,998,250 | 3/1991 | Kohlmeier et al. ................ 371/22.6 |
| 5,101,152 | 3/1992 | Harwood et al. ............... 324/158 T |

FOREIGN PATENT DOCUMENTS 0292137 of 1988 European Pat. Off. .
1558502 1/1980 United Kingdom .

Primary Examiner—Vinh Nguyen
Attorney, Agent, or Firm—Walter C. Farley

[57] ABSTRACT

A method for testing a semiconductor integrated circuit soldered into a printed circuit board makes use of the existence of parasitic transistors which occur on integrated circuits having diodes formed thereon. The method includes applying a voltage across the pins of the integrated circuit to be tested, measuring currents resulting from the voltage applied across the pins of the integrated circuit, connecting a transistor tester to selected pins of the integrated circuit, and determining typical control or switching characteristics of a parasitic transistor (1T, 2T) of the semiconducting integrated circuit (IC1, IC2). A commercial transistor tester is usable to perform the method.

5 Claims, 4 Drawing Sheets

METHOD FOR TESTING SEMICONDUCTOR INTEGRATED CIRCUITS SOLDERED TO BOARDS AND USE OF A TRANSISTOR TESTER FOR THIS METHOD

FIELD OF THE INVENTION

The invention concerns a method for testing integrated circuits and the use of a transistor tester in carrying out this method.

BACKGROUND OF THE INVENTION

When manufacturing electronic circuits, semiconductor integrated circuits (ICs) are mounted on boards of the type commonly known as printed circuit boards. It is important in the process that the ICs be properly soldered at their terminal pins. Defects may occur whereby individual IC pins do not make the right contact.

Following assembly, the boards must be tested for proper operation. The state of the art offers two possibilities. On one hand, a full-function test may be carried out. All board inputs and outputs are connected to a test computer and all functions are thoroughly tested. With complex circuits which are typical today, such a function test has the disadvantage that it takes a very long time. Moreover, for a variety of reasons, large circuits hardly permit full-function testing any more.

Accordingly it is better to test the ICs before they are soldered to the board and merely to test for proper contacts following board assembly.

Procedures already are known by which the contacts of ICs soldered to boards are tested by checking the diode between two IC pins. The diode characteristic can be ascertained by one simple measurement and one can reliably conclude that this diode is still properly functioning and, most of all, that the two pins of the diode being measured were properly soldered.

If now these two IC pins are connected to two conducting strips of a board and these two strips are connected to a test device, an unequivocal test result must follow. But problems will arise when several diodes of one or more ICs are connected in parallel to the two conducting strips making contact with the test device. In that case, it is difficult to ascertain whether current passes through all the parallel diodes or whether, for instance, one of them remains non-conducting because of defective contact-making. This ambiguity arises because there are large manufacturing tolerances for the diode characteristics and because, by the nature of making IC diodes, they intrinsically evince characteristics with high dispersions. Where there are several parallel diodes, the measured current cannot unequivocally reveal whether all diodes were properly connected or whether one has failed on account of a contact defect, for instance. As a result, the applicability of this procedure, which is known as node-impedance measurement, is restricted to a narrow range.

SUMMARY OF THE INVENTION

Accordingly an object of the present invention is to provide a method for testing integrated circuits allowing unambiguous testing of individual IC's even in the presence of complex interconnections.

This object is achieved by the invention by a method comprising the steps of measuring the currents set up by a voltage applied across the pins of an integrated circuit mounted on a board. The typical control or switching characteristics of a parasitic transistor of the semiconductor integrated circuit are determined using a transistor tester making contact with the pins of the integrated circuit mounted on the board and leading to the parasitic transistor.

In this context, the term "transistor tester" will be used to refer to an instrument commercially sold for the special purpose of testing transistors, but it can also refer to any of several more general purpose instruments which are usable to test transistors but which also have other functions and capabilities.

The invention makes use of the fact that not only diodes are present between the IC pins, but also transistors. These are not the transistors shown by the IC circuit diagram and which on account of the inner wiring cannot be driven through the IC pins, but rather they are the so-called parasitic transistors. The latter are known per se from the literature, though only on account of their interfering features. Parasitic transistors arise in IC's whenever diodes go from a pin which is to be hooked up as a base to two other pins. The parasitic transistors may evince transistor characteristics very much of their own. However, the typical control or switching characteristics of a transistor always can be ascertained which display the proper transistor operation. The advantage over the known node impedance method is that, because a transistor is connected to three pins in an IC, it is virtually impossible that, in the course of testing, two different parasitic transistors should be in parallel. With each measurement therefore only three of an IC's pins will be tested separately without the measurement being significantly affected by the board's parallel circuit parts. Reliable analysis of a specific IC can therefore be made by this localization.

The method of the invention also is applicable when in some ignorance of the IC being involved, namely sampling sets of three IC pins until suitable parasitic transistors have been found which are recognized by their transistor characteristics. Preferably, however, the method of the invention can be used wherein an IC ultimately to be tested on the board beforehand will be tested while as yet unassembled while determining a diode equivalent circuit disclosing all the diodes present between pairs of pins. This procedure allows recognizing parasitic transistors which then can be targeted for testing when the IC's have been assembled.

A transistor tester can be used for performing the method of the invention.

BRIEF DESCRIPTION OF THE DRAWINGS

The invention is illustrated in schematic manner in the drawings wherein.

DESCRIPTION OF THE PREFERRED EMBODIMENTS

A typical testing problem will now be discussed with reference to FIG. 1. Two semiconducting integrated circuits IC1 and IC2 are soldered onto a board, the output 2 from IC1 being directly connected to the input 4 of IC2. Both ICs are inverters of which the circuit is shown in FIG. 2. The pins to be mounted on the board are referenced by numerals as follows:

| | |
|---|---|
| 1 | ground |
| 2 | power (VCC) |
| 3 | input |
| 4 | output. |

As shown by the circuit of FIG. 2, each inverter IC1 and IC2 is provided at its input 4 with a protective diode SD relative to ground 1 and a parasitic diode PD shown in dashed lines between the output 2 and ground. As a rule this parasitic diode is omitted in data books, but it is virtually always present in ICs. It is formed between the line 2 and the ground on the substrate of the integrated circuit.

Figure 1:
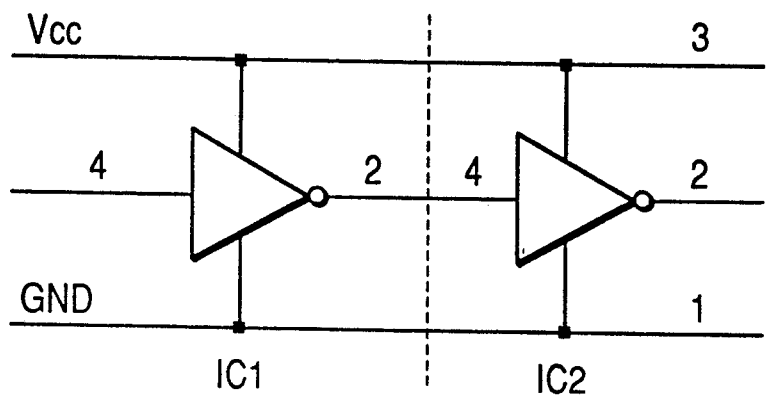
FIG. 1 is a schematic block diagram showing two inverters wired onto a board and to be tested.
Figure 2:
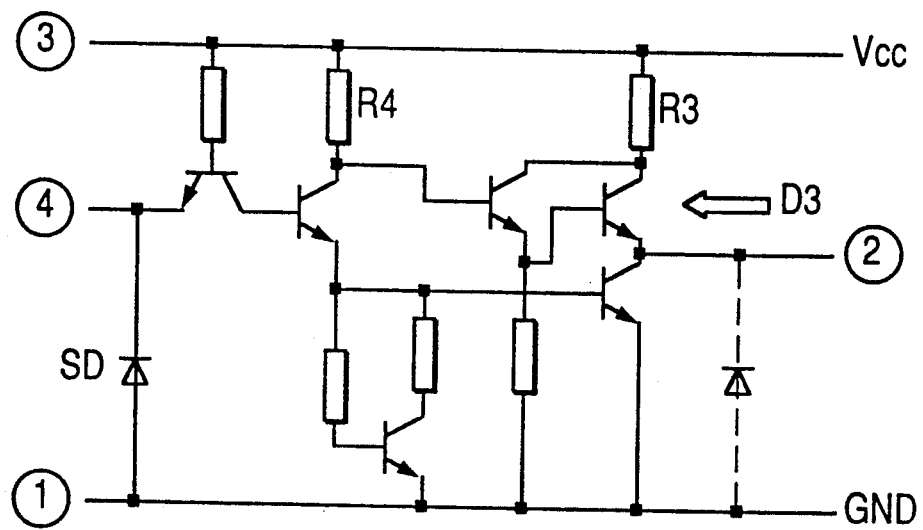
FIG. 2 is a schematic circuit diagram of one of the inverters of FIG. 1.

If now the circuit of FIG. 1 is tested using the known node impedance procedure, then it would be necessary to make contact on the board with the line connecting the output 2 of IC1 to the input 4 of IC2 and with the ground 1. The diode characteristics then would be determined between these two lines. As shown by FIG. 2, this measurement however would mean measuring two parallel diodes, the parasitic diode PD being present at the output of IC1 parallel to the protective diode PD at the input of IC2. The characteristics of the diodes SD and PD being so different, it may happen that the difference in current through one of the two diodes at a particular applied voltage and the current through the two parallel diodes will be less than that ascribable to manufacturing tolerances. In that case there is no way of ascertaining whether the two diodes are properly connected or whether one of the two is unconnected because of an IC defect or its connection to the IC board.

Figure 3:
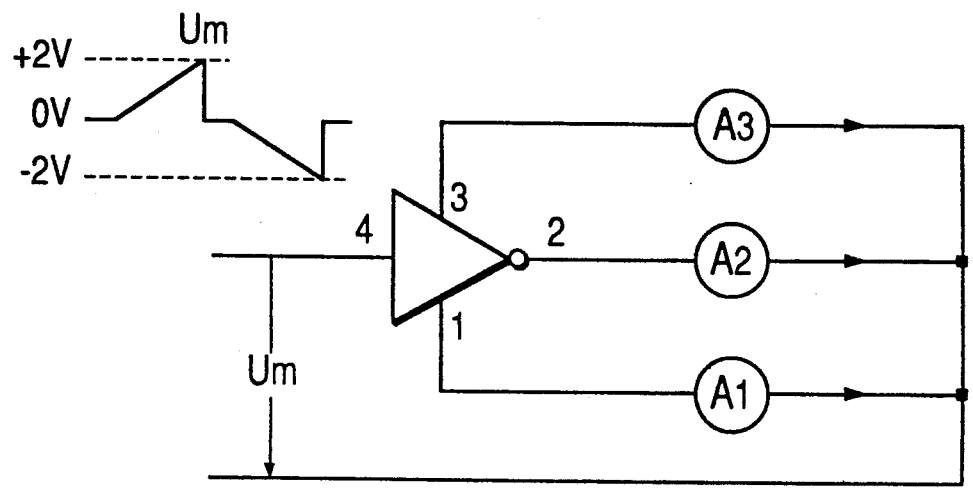
FIG. 3 is a block diagram of a circuit to determine the diode equivalent circuit of one of the inverters of FIG. 1.

The invention solves this problem as follows:

FIG. 3 shows one of the inverters of FIG. 1 when being measured, a variable voltage Um with variable sign being applied to pin 4, namely, as shown in this Figure, ranging from −2 v to +2 v, and being tested for current relative to the other three parallel pins 1, 2 and 3. A test circuit such as FIG. 3 allows the ascertaining of the inverter-equivalent diode circuit shown in FIG. 4. This diode equivalent circuit shows where current may exist through the diodes and between which pins.

As a rule two equally polarized diodes are present on the same substrate, and if so, they will jointly form a parasitic transistor. This is the case represented in FIG. 4 as shown by the two diodes SD and PD. The pins 2 and 4 can be used respectively as emitter or collector, the polarity being immaterial. Pin 1 forms the base of the parasitic transistor. Another parasitic transistor may be formed by the diodes SD and D3 and the series resistances R3 and R4. Referring to FIG. 2, it is seen that D3 is the collector diode of a real transistor. For the parasitic transistor, pin 1 again would be the base and pins 3 and 4 may be used as emitter or collector.

Figure 4:
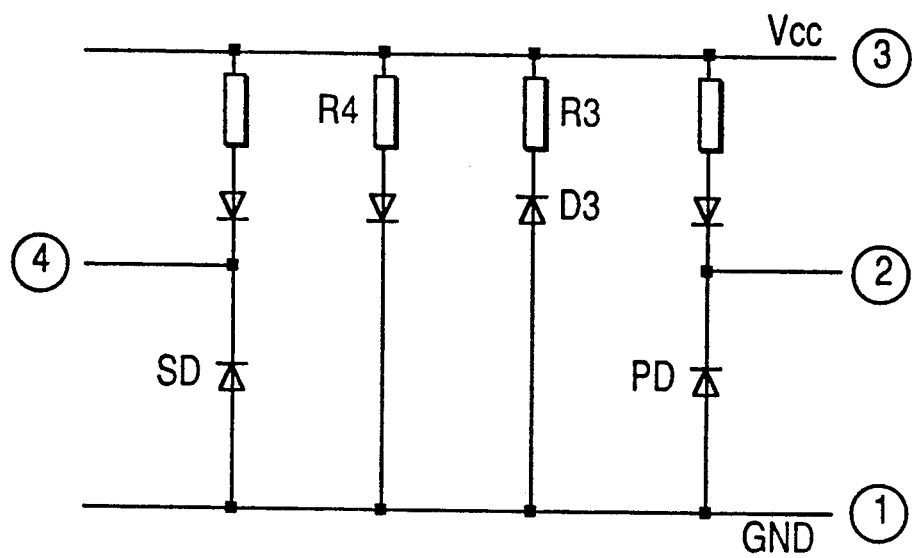
FIG. 4 is a schematic diagram of the diode equivalent circuit of one of the inverters of FIG. 1.

The parasitic transistors can be determined from the diode equivalent circuit derived from the test circuit of FIG. 3 and shown in FIG. 4. However, a transistor tester also may be used as a probe on all pin combinations of the IC being tested until all parasitic transistors present have been found. It is not always mandatory that all possible transistors be determined, rather it is frequently sufficient only to determine those required for checking that certain pins make the proper contacts.

Figure 5:
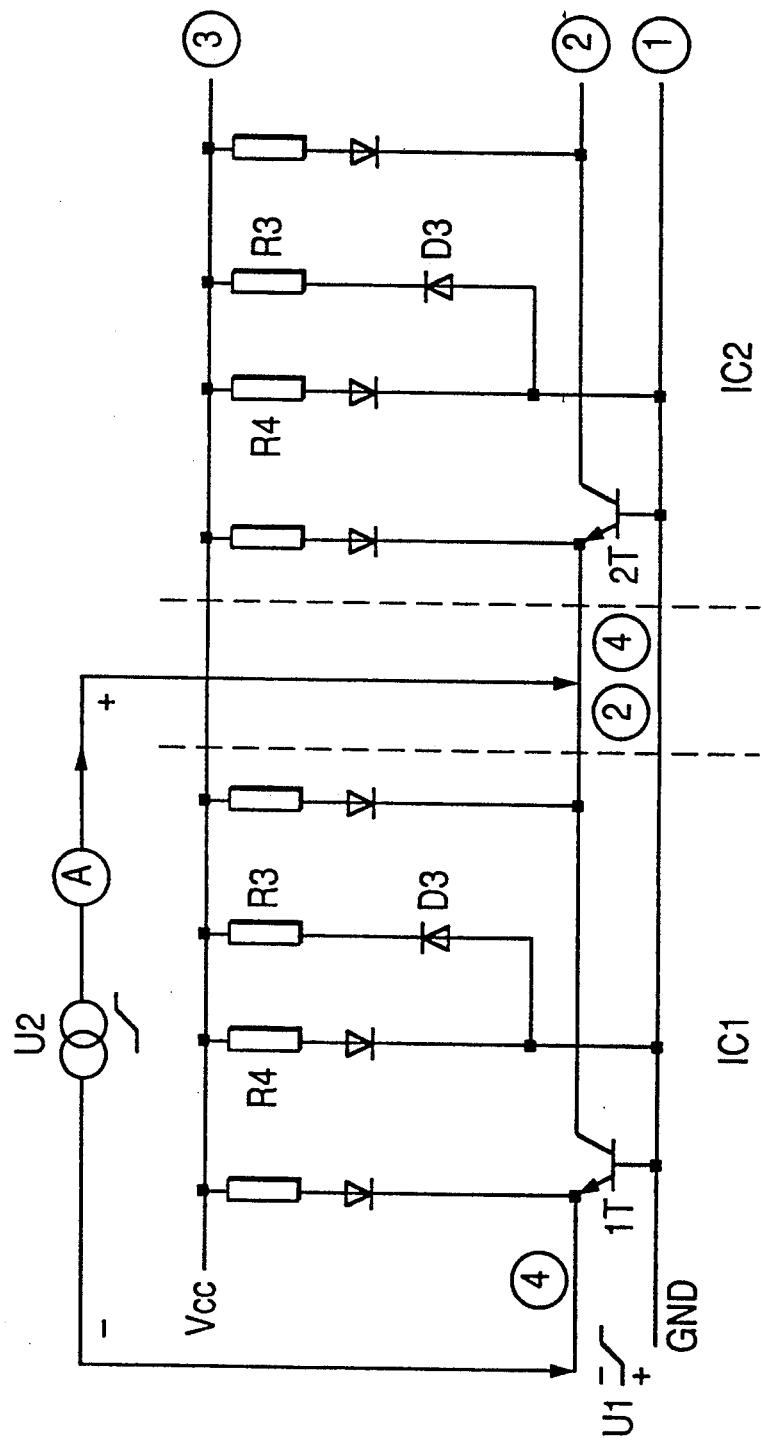
FIG. 5 is a schematic diagram of the diode equivalent circuit of the two inverters wired as shown in FIG. 1.

FIG. 5 shows the circuit of FIG. 1 using the diode equivalent circuit of FIG. 4 for the two inverters IC1 and IC2. The parasitic transistor formed by the diodes SD and PD in both cases is shown as a conventional transistor. The parasitic transistor of IC1 is denoted by 1T and that of IC2 by 2T.

In the invention, the circuits IC1 and IC2 are tested by testing their parasitic transistors 1T and 2T.

Let IC1 be tested first. As shown by FIG. 5, a transistor tester is applied first to pins 1, 4 and 2 of IC1. A variable base voltage U1 is applied between 1 and 4. A variable collector-emitter voltage U2 is applied across 2 and 4. The collector-emitter current is determined by the meter A.

Looking at the two interconnected diode equivalent circuits of the integrated circuits IC1 and IC2, it will be seen that only the base-emitter path of transistor 2T of IC2 is parallel with the transistor 1T to be measured. It is clear, however, that a reverse-bias voltage is applied to that path. Moreover, its collector is non-conducting. Therefore, no current interfering with the measurements on transistor 1T can be present in the transistor 2T. Therefore, the invention allows checking by means of a transistor tester the proper wiring of pins 1, 2 and 4 of IC1 without being adversely affected by parallel circuits such as the parasitic transistor 2T of IC2.

Figure 6:
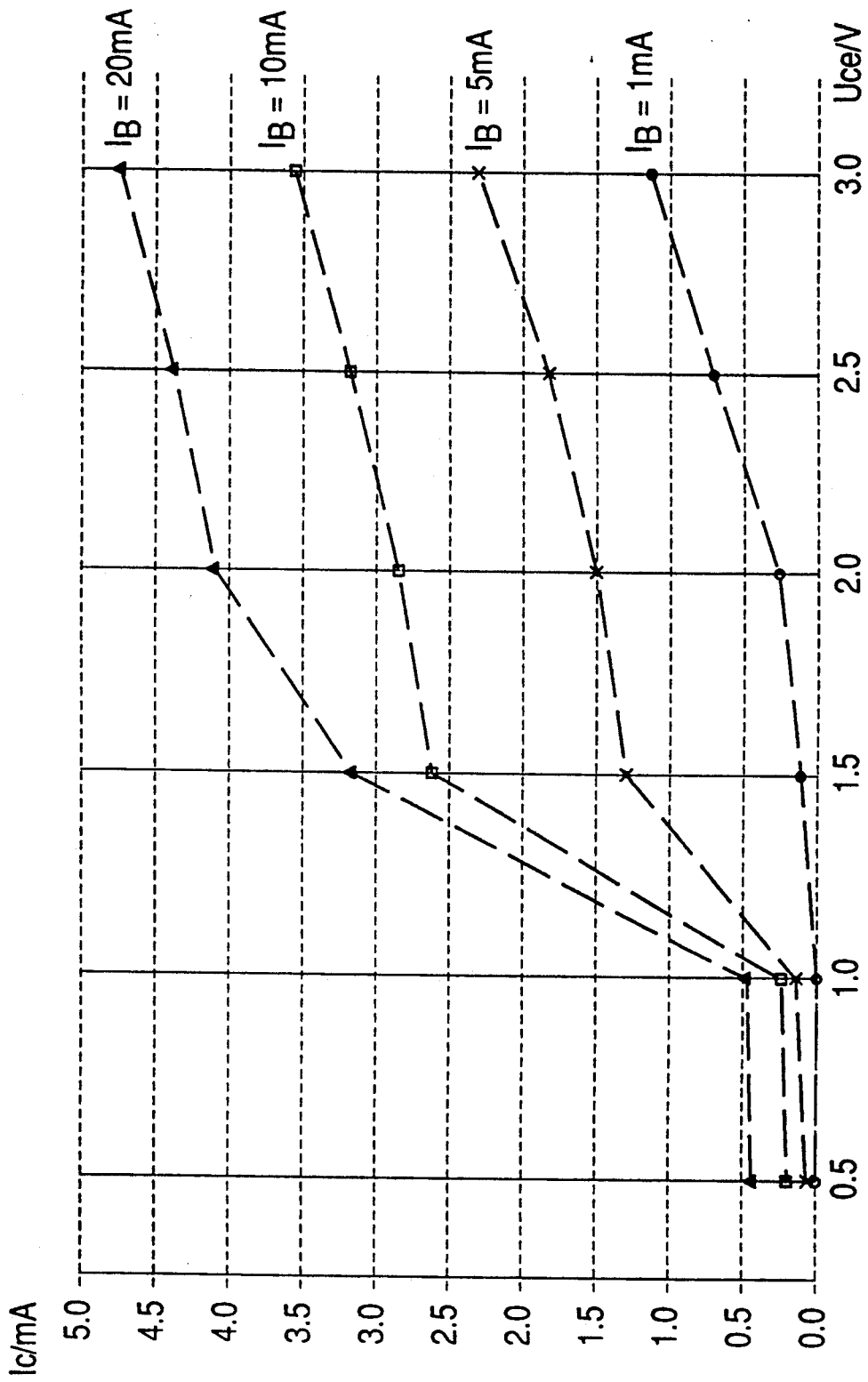
FIG. 6 is a graphical representation of the characteristics of one parasitic IC transistor.

FIG. 6 shows a typical family of transistor characteristic lines as may be ascertained from the transistor tester connected according to FIG. 5. The collector currents Ic (in ma) are plotted as a function of the collector-emitter voltage Uce (in v). The base current IB in ma is shown as the parameter of these curves. These curves provide unequivocal conclusions about a valid transistor function.

However, the presence of a transistor between three contact pins also may be ascertained in a manner other than by determining the transistor characteristics. Arbitrary control or switching properties typical of transistors may be ascertained. The transistor may be measured as grounded emitter, grounded base or grounded collector.

FIG. 5 shows the transistor tester measuring the parasitic transistor 1T of IC1, the partially parallel parasitic transistor 2T of IC2 failing to interfere. If now IC2 shall be measured, the transistor tester is connected to IC2 in precisely the same manner as it is shown connected to IC1 in FIG. 1. Accordingly the collector-emitter voltage U2 and the emitter-base voltage U1 are applied to 2T. Again the wrong-polarity collector-base voltage is applied to the partially parallel parasitic transistor T1 and the emitter is non-conducting, whereby no interfering current can be present in transistor 1T. In this case as well the transistor 2T is measured, being fully isolated.

When measuring the parasitic transistor 1T, the pins 1, 2 and 4 of the integrated circuit can be checked out—however not pin 3 for the power supply. To check this pin too, the transistor tester would have to be connected to pins 4, 1 and 3, with 1 again being the base and 3 and 4 collector and emitter. Then, as already explained in relation to FIG. 4, the diodes SD and D3 would form a parasitic transistor, and the resistances R3 and R4 would in fact affect the current values but nevertheless they leave unaffected the transistor characteristics typified by FIG. 6.

Integrated circuits soldered to boards also may be tested by the method of the invention if these circuits evince large numbers of specified parallel inputs, for instance if there are several IC's with inputs on a bus. Then, as explained in relation to FIG. 5, parasitic transistors of individual IC's can be determined individually and isolated from one another even though they are partially parallel on the board.

What is claimed is:

1. A method of testing an integrated circuit comprising the steps of
    determining the existence of parasitic transistors in an integrated circuit of a first type while the integrated circuit is unattached to a circuit board by ascertaining diode characteristics of combinations of two pins at a time,
    connecting a transistor tester to selected pins of the integrated circuit,
    applying a voltage across the pins of an integrated circuit of said first type with the transistor tester while said integrated circuit is soldered to a circuit board,
    measuring the currents resulting from the voltage applied across the pins of the integrated circuit, and
    determining from the measured currents control characteristics of a parasitic transistor of the integrated circuit using the tester.

2. A method for testing a semiconductor integrated circuit having a plurality of pins soldered to a circuit board comprising the steps of
    selecting a set of three pins of the integrated circuit of which one is a ground pin of the integrated circuit and the other two are non-ground pins,
    connecting a non-ground pin of said set to a ground connection of a transistor tester,
    connecting the other non-ground pin of the set to a first output of the tester providing a first voltage, the first voltage being selected to draw current from the collector of a conducting transistor,
    connecting the ground pin of the set to a second output of the tester delivering a second voltage, the second voltage being of a value selected to cause a transistor to become conductive when applied between its base and emitter electrodes, and
    determining whether the part of the integrated circuit connected to the set of selected pins of the integrated circuit responds to the voltages in the way a conductive transistor would respond.

3. A method according to claim 2 wherein the transistor tester is a commercial transistor tester.

4. A method according to claim 2 and including
    connecting the tester to a different set of three pins and repeating the steps of applying voltage, measuring current and determining characteristics.

5. A method according to claim 4 and including the steps of connecting, applying voltage, measuring current and determining characteristics with different sets of three pins until all permutations of sets of three pins of the integrated circuit have been tested.

* * * * *